United States Patent
Humpston (10) Patent No.: US 7,443,597 B2
(45) Date of Patent: Oct. 28, 2008

(54) LIQUID LENS WITH PIEZOELECTRIC VOLTAGE CONVERTER

(75) Inventor: Giles Humpston, Aylesbury (GB)

(73) Assignee: Tessera, Inc., San Jose, CA (US)

( * ) Notice: Subject to any disclaimer, the term of this patent is extended or adjusted under 35 U.S.C. 154(b) by 145 days.

(21) Appl. No.: 11/318,821

(22) Filed: Dec. 27, 2005

(65) Prior Publication Data

US 2007/0146894 A1   Jun. 28, 2007

(51) Int. Cl.
*G02B 1/06* (2006.01)

(52) U.S. Cl. .................................. 359/665; 359/796

(58) Field of Classification Search .......... 359/665–666
See application file for complete search history.

(56) References Cited

U.S. PATENT DOCUMENTS

| | | | |
|---|---|---|---|
| 5,091,801 A * | 2/1992 | Ebstein | 359/665 |
| 6,538,823 B2 | 3/2003 | Kroupenkine et al. | |
| 6,545,815 B2 | 4/2003 | Kroupenkine et al. | |
| 6,545,816 B1 | 4/2003 | Kroupenkine et al. | |
| 6,618,208 B1 | 9/2003 | Silver et al. | |
| 6,646,289 B1 | 11/2003 | Badehi | |
| 6,665,127 B2 | 12/2003 | Bao et al. | |
| 6,747,806 B2 | 6/2004 | Gelbart et al. | |
| 6,778,328 B1 | 8/2004 | Aizenberg et al. | |
| 6,891,682 B2 | 5/2005 | Aizenberg et al. | |
| 6,909,555 B2 * | 6/2005 | Wohlstadter | 359/626 |
| 6,936,196 B2 | 8/2005 | Chandross et al. | |
| 6,961,187 B2 | 11/2005 | Amanai et al. | |
| 6,965,480 B2 | 11/2005 | Kroupenkine | |
| 6,977,777 B1 | 12/2005 | Wick | |
| 6,989,626 B2 | 1/2006 | Takeda et al. | |
| 7,046,447 B2 * | 5/2006 | Raber | 359/625 |
| 2005/0002112 A1 | 1/2005 | Kroupenkine | |
| 2005/0082653 A1 | 4/2005 | McWilliams et al. | |
| 2005/0082654 A1 | 4/2005 | Humpston et al. | |
| 2005/0088754 A9 | 4/2005 | Kroupenkine | |
| 2005/0095835 A1 | 5/2005 | Humpston et al. | |
| 2005/0113912 A1 | 5/2005 | Feenstra et al. | |
| 2005/0248680 A1 | 11/2005 | Humpston | |
| 2006/0028734 A1 * | 2/2006 | Kuiper et al. | 359/676 |
| 2006/0072070 A1 | 4/2006 | Kuiper et al. | |
| 2006/0109366 A1 | 5/2006 | Humpston et al. | |

OTHER PUBLICATIONS

Humpston et al, U.S. Appl. No. 11/318,874, filed Dec. 27, 2005, entitled "Camera Modules With Liquid Optical Elements."

(Continued)

*Primary Examiner*—Jordan M Schwartz
(74) *Attorney, Agent, or Firm*—Lerner, David, Littenberg, Krumholz & Mentlik, LLP (57) ABSTRACT

An electronic camera module includes a lens or refractive element formed by a pair of immiscible liquids and having optical properties which can be varied by applying a voltage so as to deform the meniscus. One of the two liquids extends from the meniscus all the way to the front surface of the sensor, so that light passing through the meniscus does not encounter further changes in refractive index enroute to the sensor.

21 Claims, 5 Drawing Sheets

OTHER PUBLICATIONS

U.S. Appl. No. 10/949,764.
T. Krupenkin, S. Yang, and P. Mach, "Tunable liquid microlens," Applied Physics Letters, Jan. 20, 2003, vol. 82, Issue 3, pp. 316-318.
Kuiper, Hendriks, "Through a lens sharply," Spectrum IEEE, Dec. 2004 edition http://www.spectrum.ieee.org/print/4172.

U.S. Appl. No. 10/949,746.
U.S. Appl. No. 11/121,434.
U.S. Appl. No. 11/265,727.

* cited by examiner

LIQUID LENS WITH PIEZOELECTRIC VOLTAGE CONVERTER

BACKGROUND OF THE INVENTION

The present invention relates to electronic cameras and to methods and intermediate structures useful in forming the same.

An electronic camera module includes an optoelectronic sensor which includes an array of sensitive elements capable of converting light to electrical signals and optical elements for focusing an image of a scene to be captured onto the array. Most commonly, the sensor includes a semiconductor imaging chip incorporating charged coupled device ("CCD") elements or other optically sensitive elements such as p-n junctions in a CMOS structure. Each element is capable of capturing one picture element or "pixel" of the image. The imaging chip typically also includes conventional circuitry for converting the signals from the elements into a stream of data representing the image. The sensor may include either an imaging chip alone or an imaging chip together with a transparent cover which protects the sensitive elements from dust particles. There has been substantial progress in development of such sensors during the last few years; modern sensors may incorporate hundred of thousands of elements or "pixels" within a few square centimeters of chip surface area. Therefore, it has become practicable to incorporate digital cameras into devices such as cellular telephones, personal digital assistants or "PDAs" and the like. Camera modules for incorporation in such devices should be both compact and economical to manufacture.

As the size of sensors has diminished, and their capability has increased, there has been an increasing demand for improvements in the associated optical components such as lenses and in the structures and techniques used for mounting the optical components in position relative to the sensors. Moreover, the sensors and optical components must be mounted to elements of a larger assembly. Typically, the sensor is electrically connected to a printed circuit board or other circuit panel using techniques such as wire-bonding or surface-mounting. The design of the optical components and supporting structures must accommodate such electrical connections and must fit within a small volume and within a small area on the circuit panel.

It has been proposed heretofore to provide electronic cameras with so-called liquid lenses. As described, for example, in Kuiper et al., "Wet and Wild," SPIE OEMagazine, January 2005, it has been proposed to provide a lens having a refractive interface defined by two immiscible liquids in a container. One of these liquids typically is an electrically conductive liquid such as salt water, whereas the other liquid typically is a dielectric liquid such as a silicone oil. The two liquids have different refractive indices. Electrodes are provided in proximity to the container, with one electrode in contact with the conductive liquid, and with the opposite electrode extending along the circumferential wall of the container. The circumferential electrode is covered by a thin film of a dielectric solid. An electrical potential applied between the electrodes causes a phenomenon known as electrowetting, which, in turn, causes a change in the curvature of the interface or meniscus formed by the immiscible liquids. This, in turn, changes the curvature of the refractive interface. Such a structure provides an optical element having refractive properties which vary with the applied voltage. As described in the aforementioned Kuiper et al. article, such a refractive element can be used to provide a compact variable focus optical system for an electronic camera.

Variable optical elements which operate by electrowetting consume only miniscule amounts of electrical power during operation, on the order of a microwatt. However, this power must be provided in the form of signals on the order of 30-100 volts to control the shape of the meniscus. The other circuits included in devices such as cell phones and PDA's typically use about 3 to 5 volts supplied by a battery or low-voltage power supply circuit. Therefore, a special voltage-converting power supply must be provided in conjunction with the variable optical element. The voltage converting power supply circuits used heretofore have incorporated elements such as discrete transistors and inductors. These circuits are bulky, and thus substantially increase the space required for the camera. Moreover, these circuits add considerable cost and complexity to the assembly.

SUMMARY OF THE INVENTION

One aspect of the invention provides a variable optical element. The variable optical element according to this aspect of the invention desirably includes a first liquid, a second liquid having an index of refraction different from the first liquid, control electrodes in proximity to the first and second liquids, and may also include a structure containing the liquids. The first and second liquids form a meniscus. The electrodes and the liquids are arranged so that the curvature of the meniscus can be altered by varying an electrical potential between the electrodes. The variable optical element according to this aspect of the invention most preferably also includes a piezoelectric transformer. The piezoelectric transformer incorporates a primary piezoelectric element and a secondary piezoelectric element mechanically linked to the primary piezoelectric element. The secondary piezoelectric element is electrically connected to the control electrodes. In operation, an electrical signal applied to the primary piezoelectric element causes deformation of the primary piezoelectric element, which in turn causes deformation of the secondary piezoelectric element. Deformation of the secondary piezoelectric element results in a secondary signal. The secondary signal desirably is at a voltage many times that of the primary signal. Stated another way, the piezoelectric transformer can provide a high ratio of secondary signal voltage to primary signal voltage, also referred to as the "transformation ratio," in a compact device with low power consumption. Satisfactory operation can be achieved with a primary signal of a few volts, in the range commonly used for other elements of digital devices.

A further aspect of the invention provides a digital camera. The digital camera according to this aspect of the invention typically includes a variable lens assembly. The lens assembly includes a first liquid, a second liquid having an index of refraction different from the first liquid, control electrodes in proximity to the first and second liquids, and a container structure containing the liquids. The first and second liquids form a meniscus. The electrodes and the liquids are arranged so that the curvature of the meniscus can be altered by varying an electrical potential between the electrodes. The camera according to this aspect of the invention most preferably also includes a piezoelectric transformer including a primary piezoelectric element and a secondary piezoelectric element mechanically linked to the primary piezoelectric element, the secondary piezoelectric element being electrically connected to the control electrodes. The camera desirably further includes an optoelectronic sensor mounted in a preselected spatial relationship to the space defined by the container structure, and hence to the meniscus.

The camera according to preferred embodiments of the invention can be extremely compact. The piezoelectric transformer may be much smaller than a conventional voltage-converting power supply. Moreover, the piezoelectric transformer may be mounted so that the piezoelectric transformer is at least partially aligned with the sensor. The camera may include a circuit panel, and the optoelectronic sensor, the container structure and the piezoelectric transformer may be mounted to the circuit panel. The area of the circuit panel occupied by the assembly may be less than the sum of the areas occupied by the sensor and the transformer.

The entire camera may be constructed as a pre-assembled module which can be attached to the circuit panel, typically in a single operation, thereby simplifying manufacture of the device including the camera.

A related aspect of the invention provides a module referred to herein as an "optical module" which includes a variable optical element as discussed above and which also has the piezoelectric transformer mechanically connected to the variable lens, as by mounting the transformer to the structure holding the first and second liquids. The optical module according to this aspect of the invention can be handled, shipped and stocked as a discrete component. The optical module may be united with an optoelectronic sensor to form a camera module which can be subsequently mounted to a circuit panel or otherwise used in a larger assembly. Alternatively, the optical module according to this aspect of the invention may be united with an optoelectronic sensor when both are united with other elements of the larger assembly as, for example, by mounting both the optical module and the sensor to a circuit panel.

A further aspect of the invention provides a module, referred to herein as a "sensor module," which includes an optoelectronic sensor and a piezoelectric transformer mechanically connected to one another. The sensor module according to this aspect of the invention also may be handled, shipped and stocked as a unit, and may be united with a variable optical element as discussed above to form a digital camera.

DETAILED DESCRIPTION

A camera module 10 (FIG. 1) according to one embodiment of the invention includes an optoelectronic sensor 12. The sensor has a body which includes a front surface 14 and an array of optically sensitive elements 16 such as CCD imaging cells arranged so that light impinging on the front surface 14 will pass to these optically sensitive elements. In the particular embodiment depicted in FIG. 1, the sensor body includes a semiconductor chip 18 and a cover 20 which is transparent, at least in those regions aligned with optically sensitive elements 16. Cover 20 typically is formed from glass or a transparent polymer. Cover 20 has an inner surface 22 facing toward chip 18 and an outer surface facing away from the chip, this outer surface constituting the front surface 14 of the sensor. A structure including a generally cylindrical, tubular container wall 26 projects from the outer surface 24 of cover 20. Container wall 26 may be formed integrally with cover 20, or may be assembled to the cover. The container wall 26 defines a generally cylindrical space 28 having an axis 30 which is aligned with the center of the array of sensing elements 16.

Figure 1:
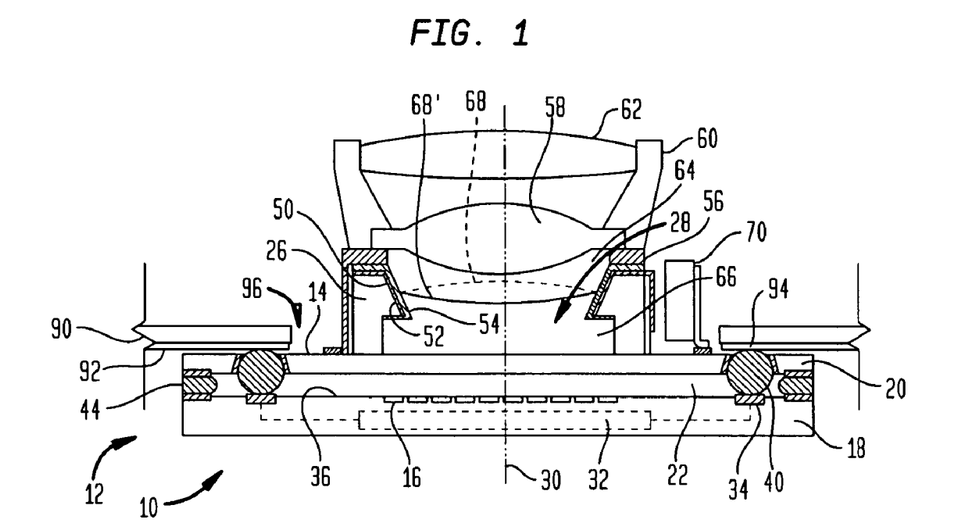
FIG. 1 is a diagrammatic sectional view depicting a digital camera incorporating a camera module according to one embodiment of the present invention in conjunction with a circuit panel.

Chip 18 includes electrical circuitry schematically indicated at 32 connected to optically sensitive elements 16 for driving the sensitive elements and processing the signals from the sensitive elements into a desired form for output from the chip. For example, in the case of a typical CCD imaging chip, circuitry 32 is arranged to actuate the actual charge coupled device cells cyclically and to read out the signals from the numerous cells in order, according to rows and/or columns. The circuitry is also arranged to convert these signals into digital form so that the output signals include a series or parallel data stream with digital bytes of information denoting the intensity of light received by the various pixels. If the chip is a color imaging chip, the chip may include wavelength-sensitive filters on some or all cells, or may include cells having semiconductor elements sensitive to different wavelengths. The particular circuitry and internal structure of the chip may be entirely conventional, and accordingly is not further described herein. However, references to "light" herein should be understood as including radiation in the ultraviolet and infrared ranges, as well as radiation in the visible range, unless otherwise specified. Similarly, references to "optical", elements should be understood as including elements suitable for use with ultraviolet or infrared radiation, as well as elements suitable for use with visible light.

The circuitry of the chip is connected to contacts 34, which, in this embodiment, are disposed on the front surface 36 of the chip, i.e., the surface bearing sensitive elements 16 and facing toward the cover 20. Contacts 34 are electrically connected by through conductors 38 to electrical terminals 40, referred to herein as "sensor terminals" exposed at the outer surface 14 of the cover. The through conductors 38 themselves may form a part or all of the terminals. Also, as used in this disclosure, a terminal "exposed at" a surface of a dielectric element may be flush with such surface; recessed relative to such surface; or protruding from such surface, so long as the terminal is accessible for contact by a theoretical point moving towards the surface in a direction perpendicular to the surface. The through conductors may include elements such as solid metallic spheres, solder connections or other metallic elements. Also, sensor terminals 40 may be disposed at the same locations as through conductors 38, or at different locations. Moreover, some of the sensor terminals may not be connected to contacts 34, and some of the contacts 34 may be "dummy" terminals not to the internal circuitry 32 of the chip.

The sensor also has additional terminals 41 exposed at the front surface 14, these additional terminals 41 being referred to herein as "lens control" terminals. The lens control terminals 41 may or may not be connected to the internal circuitry of 32 of the sensor as explained below. Terminals 40 and 41, and through conductors 38 desirably are disposed in peripheral regions of the chip and cover, outside of a central region enclosed by container wall 26.

A seal 44 extends between the cover 20 and semiconductor chip 18. This seal may be formed in the same process as is used to apply the cover. The seal desirably extends around the entire periphery of the chip and cover. The through conductors and seal desirably are arranged so that the outer surface 14 of the cover is precisely parallel to the front surface 36 of the chip to within a close tolerance.

Container wall 26 has a tapered portion 50 sloping inwardly towards axis 30 in the rearward or downward direction, towards chip 18 (the direction towards the bottom of the drawing as seen in FIG. 1). An electrode 52 covers the sloping portion 50 and extends around the entire periphery of the container. The electrode, in turn, is covered by a dielectric coating 54. Electrode 52 may be a discrete metallic element or may be a metallic or other conductive coating applied on the surface of the sloping wall portion 50. Dielectric 54 most desirably is as thin as possible, while providing a pinhole-free dielectric coating having dielectric strength sufficient to withstand the voltages to be applied in service, typically on the order of a few hundred volts or less, as discussed below. Also, the dielectric coating most preferably is a coating which is hydrophobic, i.e., which is not normally wetted by water. For example, dielectric coating 54 may include a conformal coating, as, for example, a polyparaxylene or other vapor-deposited coating a few microns thick. The dielectric coating 54 may include a fluoropolymer or a polymer having a substantial preponderance of alkyl moieties at its surface. In one example, the dielectric coating includes a parylene-N coating covered by a fluoropolymer. A further electrode 56 is exposed to the interior of bore 28 at one end of the tapered section.

The structure projecting from the sensor includes a closure 58 covering the end of bore 28. In this embodiment, the closure 58 is in the form of a rigid convex lens, but this feature is optional; the closure may be a simple planar element or another optical element such as a filter. The structure optionally includes a further support 60 extending forwardly from container wall 26 and closure 58, and holding one or more additional optical elements such as a lens 62.

Two immiscible liquids 64 and 66 are disposed within bore 28. Liquid 64, disposed in contact with electrode 56 desirably is an aqueous, electrically conductive liquid such as a saline solution. Liquid 66, disposed in the rearward portion of bore 28 most preferably is a silicone oil such as a phenylated silicone oil. The two liquids most preferably have substantially equal specific gravity or density. The two liquids have different indices of refraction. The immiscible liquids cooperatively define a meniscus or curved interface 68. Because the two liquids have different refractive indices, meniscus 68 serves as a refractive interface which alters the focus of light passing through the bore 28 enroute to optically sensitive elements 16. The nature and degree of this change, of course, will depend upon the curvature of the meniscus.

Figure 3:
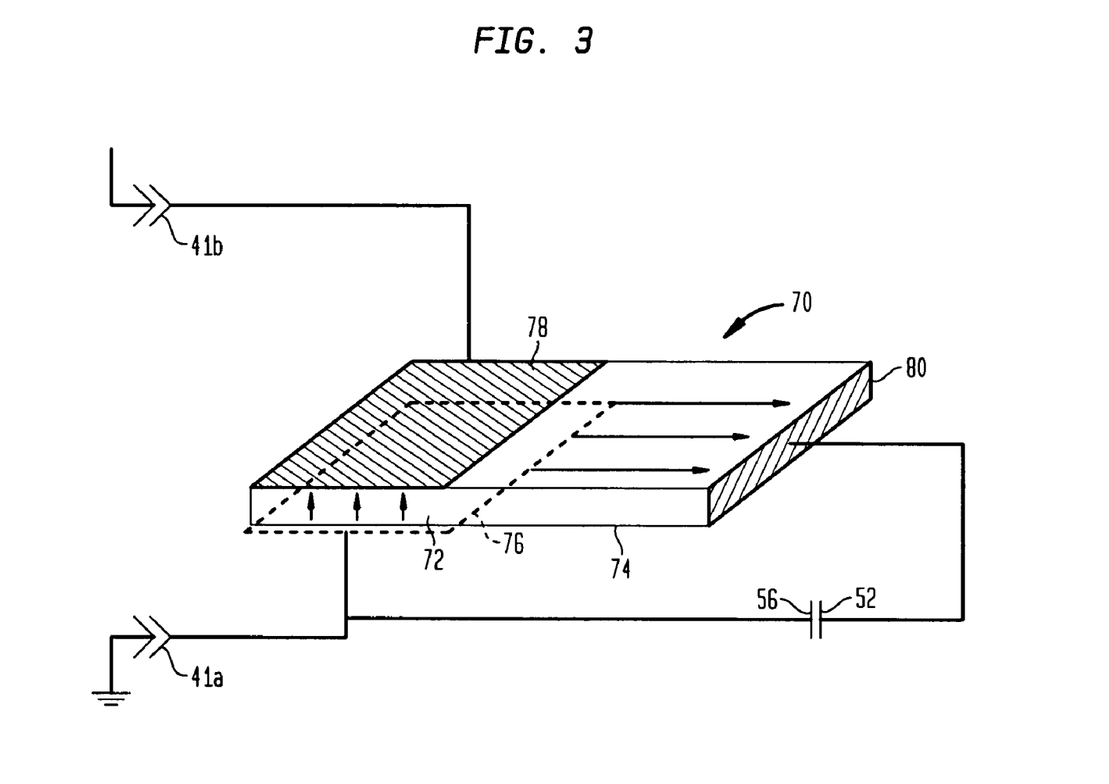
FIG. 3 is a partial electrical schematic depicting a portion of the camera module shown in FIGS. 1 and 2.

The module 10 further includes a piezoelectric transformer 70 which, in this embodiment, is mounted to sensor 12 so that the transformer overlies the front surface 14 of the sensor. As best seen in FIG. 3, transformer 70 includes a primary piezoelectric element 72 and a secondary piezoelectric element 74 mechanically linked to the primary piezoelectric element so that deformation of the primary piezoelectric element 72 will cause deformation of the secondary piezoelectric element 74. In the particular embodiment shown, the two piezoelectric elements are directly connected to one another to form a body of piezoelectric material. In the transformer depicted in FIG. 3, the body of piezoelectric material is depicted as a generally rectangular slab, with a thickness dimension (toward the top and bottom of the drawing) smaller than the length and width of the slab. The two elements have different poling directions. The primary piezoelectric element 72 has a poling direction corresponding to the thickness direction, as indicated by the vertical arrows in FIG. 3, whereas the secondary piezoelectric element 74 has a poling direction corresponding to the length of the slab, as indicated by the horizontal arrows.

In the context of a piezoelectric material, the term "poling" refers to the process of inducing a DC voltage across the material, so that ferroelectric domains of the material align to the induced field, and the term "poling direction" refers to the direction of the aligned domains after this process. The process of poling normally is performed during manufacture of the piezoelectric element. The piezoelectric material may be a ferroelectric ceramic such as such as lead zirconate titanate (PZT) or a polymeric piezoelectric material such as a polyvinylidene fluoride-trifluoroethylene copolymer.

The primary piezoelectric element 72 has a primary ground electrode 76 and a primary signal electrode 78 disposed on opposite surfaces of the slab, so that the direction between these electrodes corresponds to the poling direction of the primary piezoelectric element. The secondary piezoelectric element 74 has a secondary signal electrode 80 disposed at one end of the slab, so that the secondary signal electrode is offset, in the poling direction of the secondary piezoelectric element, from the primary ground electrode 76. Thus, the primary ground electrode 76 also serves as a ground electrode for the secondary piezoelectric element 74; in effect, the secondary element has electrodes 76 and 80 offset from one another in the poling direction of the secondary element. When a voltage is applied between the primary electrodes 76 and 78, the primary piezoelectric element 72 grows or shrinks in the thickness direction of the slab, causing the entire slab, including the secondary piezoelectric element 74, to grow or shrink in the lengthwise direction. This growth or shrinkage of the secondary piezoelectric element changes the electrical potential of the secondary signal electrode 80 with respect to the ground electrode 76. As used in this disclosure with reference to a piezoelectric voltage transformer, the term "transformation ratio" means the absolute value of the ratio of the change in voltage appearing between the electrodes associated with the secondary piezoelectric element to the change in voltage applied between the electrodes of the primary piezoelectric element. Depending on the configuration of the elements and their mechanical linkage, piezoelectric transformers may have transformation ratios from less than one to thousands or more. For use with an electrowetting variable optical element, the piezoelectric transformer most typically has a transformation ratio of about 10:1 or more, as, for example, about 10:1 to about 100:1. The particular form of piezoelectric transformer depicted in FIG. 3 is merely exemplary; other types of piezoelectric transformers can be employed. For example, certain piezoelectric transformers have primary and secondary piezoelectric elements formed separately from one another and mechanically connected to one another by an intermediate element or linkage, so that deformation of the primary element is transmitted to the secondary element. Also, the piezoelectric elements can be deformed in shear in bending, or in other modes, rather than in compression or tension. The piezoelectric elements may have essentially any shape.

Figure 2:
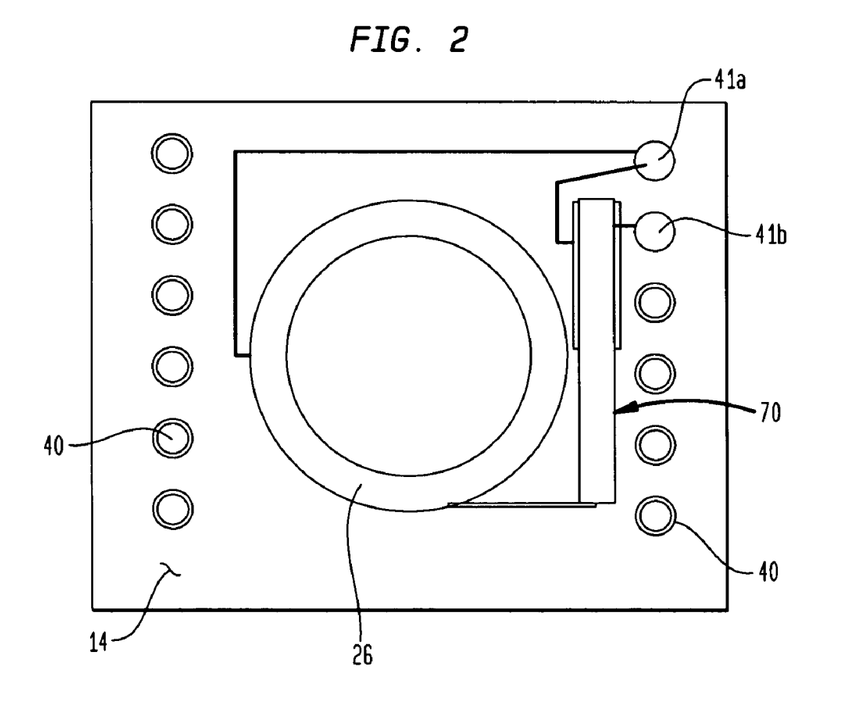
FIG. 2 is a diagrammatic top plan view of the camera module shown in FIG. 1.

In the camera module of FIGS. 1-3, the primary ground electrode 76 is connected to the one of the lens control terminals 41a (FIG. 2), whereas primary signal electrode 78 is electrically connected to another lens control terminal 41b, so that the primary piezoelectric element 72 is connected between these terminals. Terminal 41a is referred to as the lens control ground terminal, whereas terminal 41b is referred to as the lens control signal terminal. One of the control electrodes 52 of the variable optical element discussed above is connected to the secondary signal electrode 80, whereas the opposite control electrode 56 is electrically connected to the primary ground electrode, so that the control electrodes are electrically connected to the secondary piezoelectric element 74. Thus, when a voltage is applied between the lens control signal terminal 41b and the lens control ground terminal 41a, this voltage multiplied by the transformation ratio is applied between the control electrodes 52 and 56.

Figure 4:
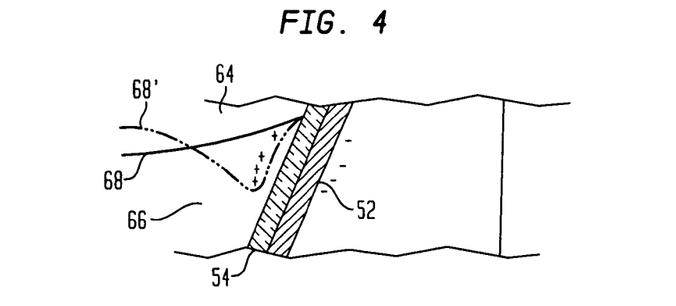
FIG. 4 is a fragmentary, diagrammatic sectional view on an enlarged scale depicting a portion of the camera module shown in FIGS. 1-3.

In the absence of an applied electrical potential between electrodes 52 and 56, the shape of the meniscus 68 (FIG. 1) is determined entirely by the wetting properties of the liquids, and accordingly may have a shape such as that shown at 68 in FIG. 1. However, when opposite voltages are applied on electrodes 52 and 56, the aqueous liquid 64 becomes electrically charged with a voltage opposite to that prevailing on electrode 52. As schematically indicated in FIG. 4, the opposite charges in fluid 64 and on electrode 52 attract one another, thereby causing the aqueous liquid to extend further down the sloping wall 50. Stated another way, the intersection between the meniscus and the sloping wall moves down the sloping wall. This action alters the shape of the meniscus and hence the shape of the refractive interface, so that the refractive interface has the configuration as shown in broken lines at 68' in FIGS. 1 and 4. The extent of this effect depends upon the applied voltage, so that by varying the voltage, the meniscus can be brought to intermediate shape between that shown in 68' and that shown in solid lines at 68. Because the shape of the refractive interface changes, the optical properties also change with the applied voltage.

Typically, a maximum operating voltage on the order of 50-100 volts is used across electrodes 52 and 56. However, because the device operates by electrostatic attraction, it does not require a current flow during operation. From an electrical point of view, the device functions as a capacitor, with electrode 56 and aqueous fluid 64 constituting one plate, and with electrode 52 constituting the opposite plate. Thus, once a charge is applied, the only current required is that necessary to compensate for leakage, if any, through dielectric layer 54, or through other components of the system. The piezoelectric voltage transformer 70 can supply the required voltage across electrodes 52 and 56 in response to a signal of a few volts or less applied between lens control signal terminal 41b and lens control ground terminal 41a.

The camera module discussed above with reference to FIGS. 1-4 can be mounted readily on a circuit panel. For example, as shown in FIG. 1, the module is mounted on a circuit panel 90 having a rear surface 92 and an oppositely-facing front surface. The sensor terminals 40 and the lens control terminals 41 (FIGS. 2 and 3) are engaged with and bonded to electrically conductive elements 94 exposed at the rear surface 92 of the circuit panel. The conductive elements of the circuit panel connect the sensor terminals 40 to signal processing elements and other circuits (not shown) of the digital camera, and connect the lens control terminals 41 to ground and to a source of a control signal voltage (not shown). This voltage source may be a manually-adjustable element as, for example, a potentiometer connected to a battery or other voltage source, or an automated element such as an automatic focusing circuit. Because the module includes transformer 70, the external source of lens control voltage is only required to supply a relatively low voltage, as, for example, 0-5 volts. This limits the voltages which must be applied to the conductors of the circuit panel and hence simplifies the design of the circuit panel.

Sensor 12 is disposed to the rear of the circuit panel (below the circuit panel as seen in FIG. 1). The front face 14 of the sensor faces forwardly, towards the circuit panel. The structure including the fluid container 26 and lenses 58 and 62 extends forward through a hole 96 in the circuit panel, so that at least a part of this structure is disposed in front of the circuit panel, i.e., above the circuit panel as seen in FIG. 1. Stated another way, at least a part of the fluid container and lens structure is disposed on the opposite side of the circuit panel 90 from the optical sensor 12.

Moreover, the piezoelectric transformer 70 also extends forwardly from the sensor 12, and also projects through the circuit panel so that at least a part of the piezoelectric transformer is disposed in front of the circuit panel. However, the piezoelectric transformer projects forwardly from the sensor to a lesser extent than the fluid container and lens structure. Therefore, the piezoelectric transformer does not add to the overall height of the assembly. As discussed above, the piezoelectric transformer 70 overlies the sensor. Therefore, the transformer does not add to the overall area of the circuit panel 90 surfaces occupied by the sensor and optical elements. This embodiment thus provides a relatively compact, low-height mounting.

The entire camera module 10 may be pre-assembled, handled, tested and stocked as a unit, and may be mounted to the circuit panel as a unit in a single operation. Most preferably, sensor terminals 40 and lens control terminals 41 are adapted for surface-mounting to the circuit panel. Thus, terminals 40 and 41 may include a solder or may be wettable by a solder, so that the entire module can be mounted to the circuit panel simply by solder-bonding the terminals to the pads of the circuit panel. Providing the voltage converter and the other elements of the variable focus lens and sensor in a single structure minimizes the number of components which must be handled, ordered and processed by the system's manufacturer. Additionally, this approach also permits testing of the complete assembly including the sensor and the variable focus lens, together with the voltage converter, prior to assembly with a circuit board or other circuit panel, thereby minimizing the need for rework of completed assemblies and improving outgoing product quality.

In the embodiment discussed above with reference to FIGS. 1-4, meniscus 68 is the refractive interface closest to the front surface 14 of the sensor, and liquid 66, which forms part of this refractive interface, is also in contact with the front surface 14 of the sensor. Therefore, light passing from refractive interface 68 passes through the liquid 66 to the front surface of the sensor without encountering any additional refractive interfaces. As explained more fully in the copending, commonly assigned U.S. patent application Ser. No. 11/318,874, filed Dec. 27, 2005, the disclosure of which is hereby incorporated by reference herein, the use of a liquid extending from the refractive interface nearest the sensor to the sensor itself provides certain advantages. By minimizing the number of interfaces in the optical system, this arrangement reduces spurious reflections and glare in the image. Moreover, the focusing effect of the optical system as a whole is enhanced by filling the space between refractive interface 68 and the front surface of the sensor.

The camera module 10 discussed above with reference to FIGS. 1-4 may be fabricated by assembling the structure including container wall 26, with or without additional optical element 62 and lens support 60, to the sensor 12 so as to form a subassembly including the container wall structure and optoelectronic sensor, and assembling the piezoelectric transformer 70 with the other elements in the subassembly before mounting the resulting module to the circuit panel. Alternatively, the subassembly including the optoelectronic sensor and container wall structure and related elements can be mounted to the circuit panel, and the piezoelectric transformer 70 can be added thereafter. Alternatively, the piezoelectric transformer can be assembled to the optoelectronic sensor 12 to form a unit which can be held and stocked and subsequently united with the container structure and associated elements.

Figure 5:
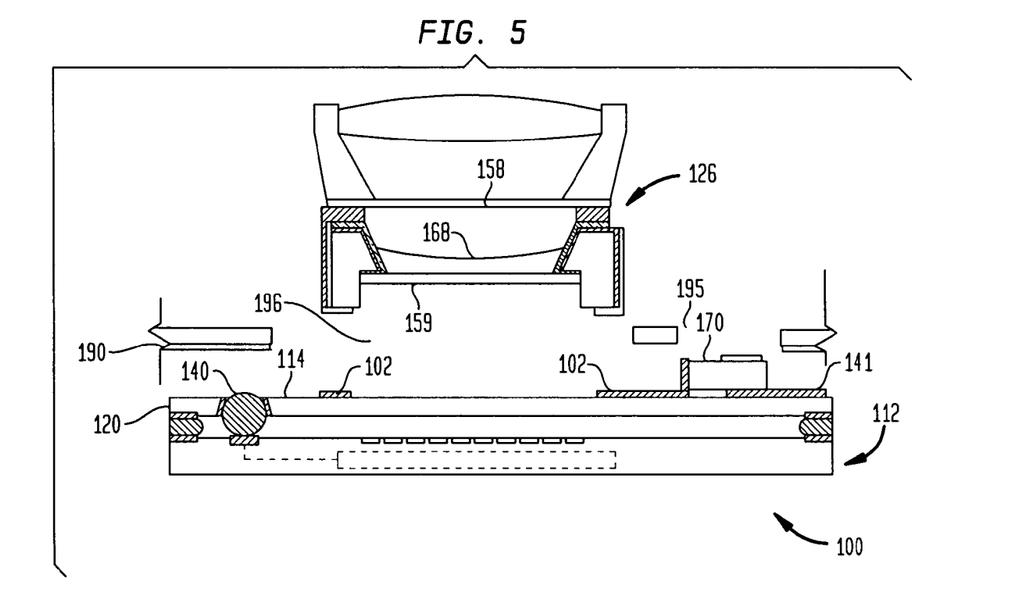
FIG. 5 is an exploded view depicting a digital camera according to a further embodiment of the invention.

A sensor module 100 (FIG. 5) according to a further embodiment of the invention includes an optoelectronic sensor 112 similar to the sensor discussed above, together with a piezoelectric transformer 170 mounted to the sensor. A surface of the optoelectronic sensor, in this case the front surface 114 defined by the cover 120, has lens control terminals 141 and sensor terminals 140. The front surface also has lens connection pads 102 and traces connected to these lens connection pads. The piezoelectric transformer is mounted on the optoelectronic sensor so that the primary piezoelectric element is connected to the lens control terminals 141, whereas the signal electrode of the piezoelectric transformer is connected to one of the mounting pads 102. The other mounting pad 102 is connected to the ground lens control terminal. This module can be assembled to a circuit panel 190, such as a printed circuit board, with the sensor terminals 140 and lens control terminals 141 connected to conductive elements of the circuit panel, and with the piezoelectric transformer 170 projecting through a hole 195 in the printed circuit panel. The connection pads 102 and the optically sensitive elements 116 of the sensor are aligned with another hole 196 in the circuit panel. A structure 126 including a container and electrode similar to those discussed above is assembled through the hole 196, so that the electrodes are connected to the mounting pads 102. This structure 126 includes two transparent closures 158 and 159 so that it will retain the liquids constituting the meniscus 168 prior to assembly with the sensor. In an alternative assembly process, the complete camera module including structure 126 together with module 100 can be assembled prior to attachment to a printed circuit panel. Here again, both the container structure and the piezoelectric element 170 extend to the front of the circuit panel (above the circuit panel as seen in FIG. 5) and hence lie on the opposite side of the circuit panel from the sensor.

Figure 6:
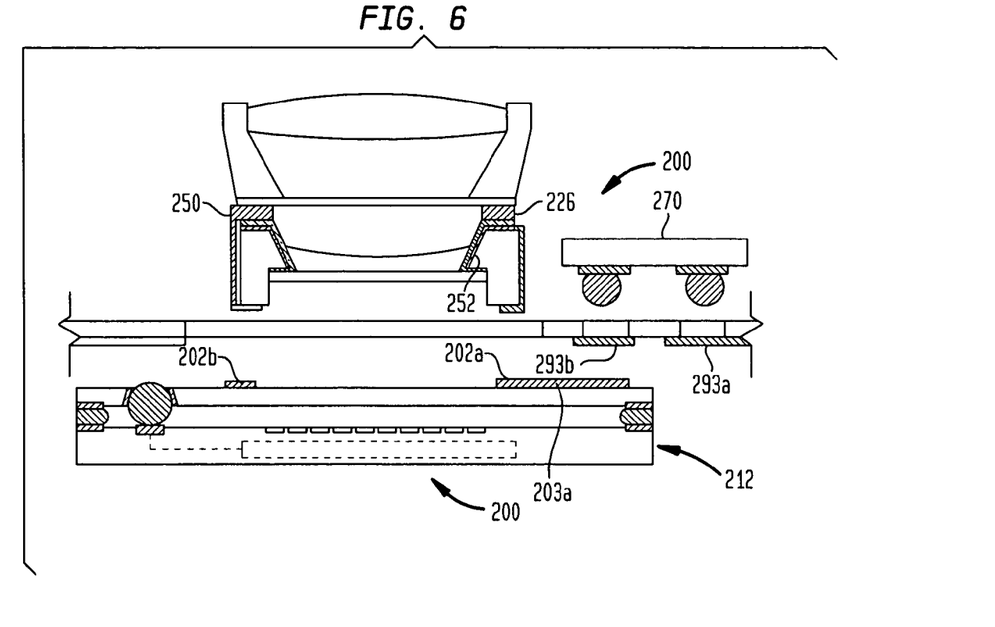
FIG. 6 is a view similar to FIG. 5, but depicting a digital camera according to yet another embodiment of the invention.

A digital camera module 200 according to a further embodiment of the invention (FIG. 6) includes a sensor 212, container and lens structure 226, and piezoelectric transformer 270 supplied as separate components. Here again, the sensor includes mounting pads 202 for connection to the electrodes in the container and lens structure. The ground and primary signal electrodes of piezoelectric transformer 270 are electrically connected to two conductive elements 293 on the circuit panel, only one such conductive element being visible in FIG. 6. Another conductive element 293*b* is connected to the secondary signal electrode of the piezoelectric transformer 270, but electrically isolated from other conductive elements on the circuit panel. That element 293*b*, carrying the signal from the secondary piezoelectric element, is electrically connected to a mounting pad 202*a* by a trace 203*a* on the sensor. Another mounting pad 202*b* is connected by a further trace (not shown) to a conductive element of the circuit panel which carries a ground potential. Mounting pads 202*z* and 202*b*, in turn, are connected to the control electrodes 252 and 258 associated with the meniscus. In the completed assembly according to this embodiment, only a portion of piezoelectric transformer 270 overlies sensor 212; another portion of the piezoelectric transformer projects beyond the edge of the sensor. Nonetheless, the assembly saves space by placing at least a portion of the piezoelectric transformer in alignment with the sensor 212, using space which would otherwise be wasted.

Figure 7:
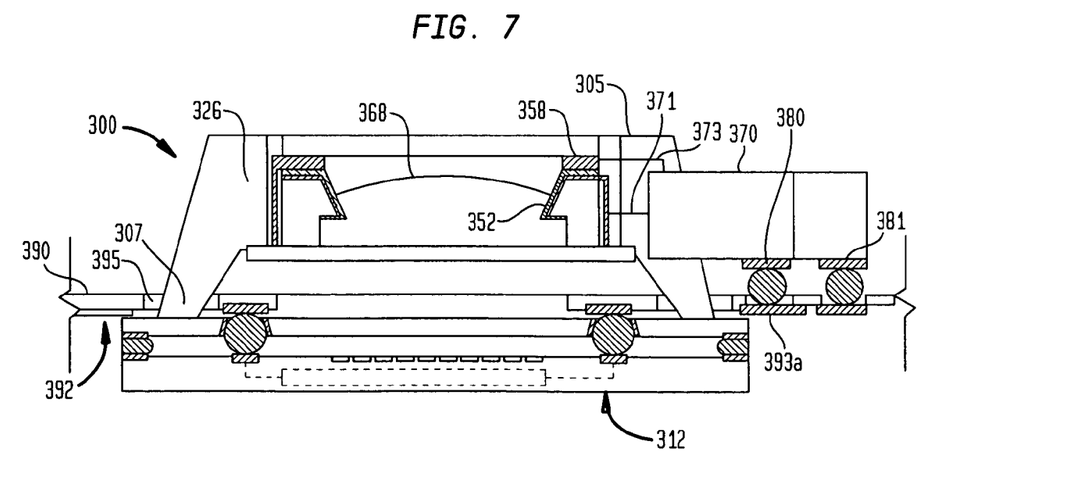
FIG. 7 is a diagrammatic sectional view depicting a digital camera according to a further embodiment of the invention.

A camera 300 according to yet another embodiment of the invention includes a preformed variable optical module 305. This module incorporates the container structure 326 holding the electrodes 352, 358, and the liquids which define the meniscus 368. Module 305 also includes a piezoelectric transformer 370 mounted to structure 326. The piezoelectric transformer 370 has a primary signal terminal 380 connected to the primary signal electrode and a ground terminal 381 connected to the primary ground electrode. The transformer is mounted to the container structure 326 so that these terminals are exposed for connection to conductive elements 393 of the circuit panel. The variable optical element assembly 305 further includes a conductor shown schematically at 371 connecting the secondary signal electrode of transformer 370 to one electrode 352 used to control the meniscus 368 and another conductor 373 connecting the opposite meniscus-control electrode 358 to the ground terminal 381 of the transformer. In a variant of this approach, the container structure 326 itself may have ground and primary signal terminals exposed for connection to the circuit panel, and the ground and primary signal electrodes of the transformer may be connected to these terminals. Structure 326 may include elements other than the container itself as, for example, appropriate brackets or projections for mounting and supporting the structure 326 itself, and for mounting the piezoelectric transformer 370. Structure 326 may also include additional optical elements (not shown).

In the embodiment of FIG. 7, the optoelectronic sensor 312 is mounted so that the sensor overlies the rear surface 392 of the circuit panel 390. Structure 326 has projecting features 307 which extend through openings 395 in the circuit panel and engage the front face 314 of the sensor, so as to hold structure 326 in accurate positional relationship with the sensor. Thus, the structure 326 may incorporate positioning features 307 similar to the features disclosed in copending commonly assigned U.S. Published Patent Application Nos. 2005/0248680, published Nov. 10, 2005; and 2006/0109366, published May 25, 2006, the disclosures of which are hereby incorporated by reference herein. As further explained in such application, mating features on the structure or turret and on the sensor serve to maintain precise perpendicularity of the axis of the structure or turret 326 and the imaging plane of the sensor. The preformed optical module 305 may be handled and stocked as a unit, and may be united with the optoelectronic sensor 312 before, after or during assembly of the sensor 312 to the circuit panel. The preformed optical module thus provides additional flexibility in manufacturing; the same assembly can be used with different types of sensors. Also, there is no need for special configuration of the sensor to work with the module.

Figure 8:
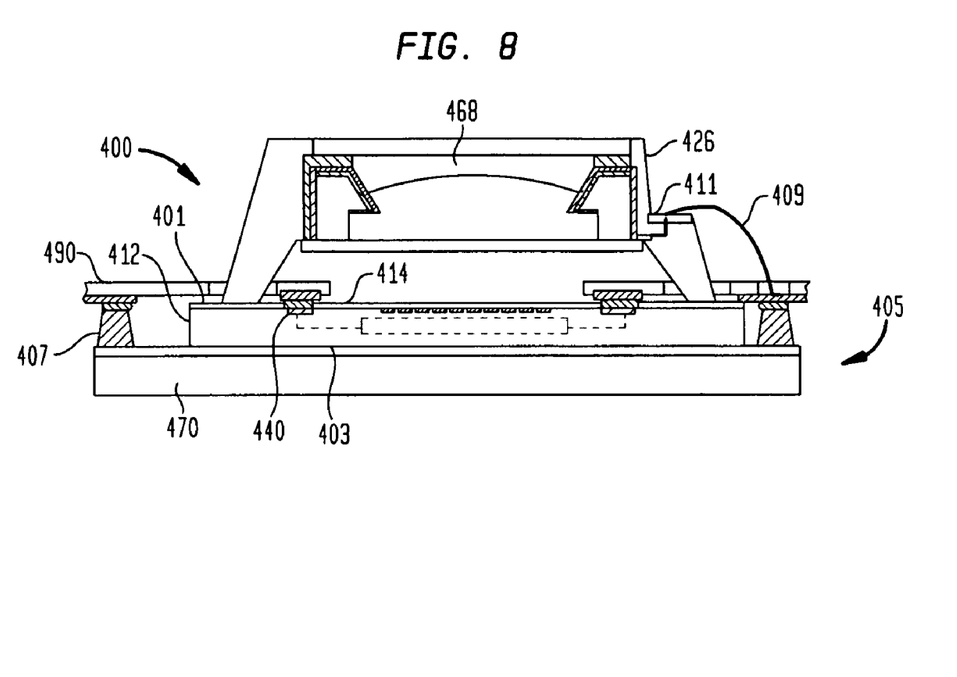
FIG. 8 is a diagrammatic sectional view depicting a digital camera according to a still further embodiment of the invention.

A sensor module 400 according to yet another embodiment of the invention (FIG. 8) includes a preformed sensor module 405 which incorporates the piezoelectric transformer 470 and the optoelectronic sensor 412. In module 405, transformer 470 overlies the rear surface of the sensor 412, i.e., the surface of the sensor opposite from the surface having the optically sensitive elements 416. In the particular embodiment shown, the sensor 412 does not incorporate a separate cover, but instead incorporates a transparent passivation layer 401 defining the front surface 414 of the sensor. Module 405 further includes a module substrate 403. Optoelectronic sensor 412 and piezoelectric transformer 470 are mounted to module substrate 403. The module substrate 403 has electrical connecting elements 407 projecting from the module substrate at one or more locations outside of the area occupied by the sensor 412. These electrical connecting elements are electrically connected to the piezoelectric transformer 470 by appropriate interconnections (not shown), as for example, by traces carried on module substrate 403 and features such as wire bonds or solder bonds connecting the traces to the electrodes of the piezoelectric transformer. Connecting elements 407 are exposed for connection to a circuit panel and serve as lens control terminals of module 405. The terminals of sensor 412 are also exposed for connection to the circuit panel and form the sensor terminals of the module. The piezoelectric transformer 470 and optoelectronic sensor 412 optionally may be adhesively bonded to the module substrate 403 or secured to the module substrate by soldering. Also, one or more electrical connections to the sensor may be made through the conductive elements 407 and associated traces or other electrical elements on the module substrate, so that connecting elements 407 also serve as sensor terminals of the module.

Module 405 may be mounted to the rear side of a circuit panel 490. Here again, the structure 426 holding the electrodes and fluids associated with the adjustable meniscus 468 overlies the front surface of the circuit panel, but rests on the front surface 414 of the sensor to maintain alignment. The electrical conductor 407 carrying the signal from the piezoelectric transformer is electrically connected through the circuit panel, as for example, a wire bond 409 extending to a pad 411 on structure 426 electrically connected to the signal electrode. The ground electrode can be similarly connected to the piezoelectric transformer or to a ground conductor (not shown) on circuit panel 490. This arrangement provides a particularly large space for the transformer; the transformer may occupy a greater surface area than the optoelectronic sensor 412. Nonetheless, the arrangement still conserves space in that the same area on the rear surface of the circuit panel used to house the optoelectronic sensor 412 also houses a portion of the piezoelectric transformer 470. The camera module of FIG. 8 may be fabricated by assembling the sensor module 405 incorporating sensor 412, substrate 403, and transformer 470 to the circuit panel and subsequently mounting structure 426 to the circuit panel and module. In a further variant, the module which includes the sensor and piezoelectric transformer also has the structure 426 carrying the meniscus fluids and electrodes mounted thereon prior to assembly of the module with the circuit panel. In still further variants, module 405 has no substrate 403. For example, transformer 470 may be fastened directly to sensor 412.

Figure 9:
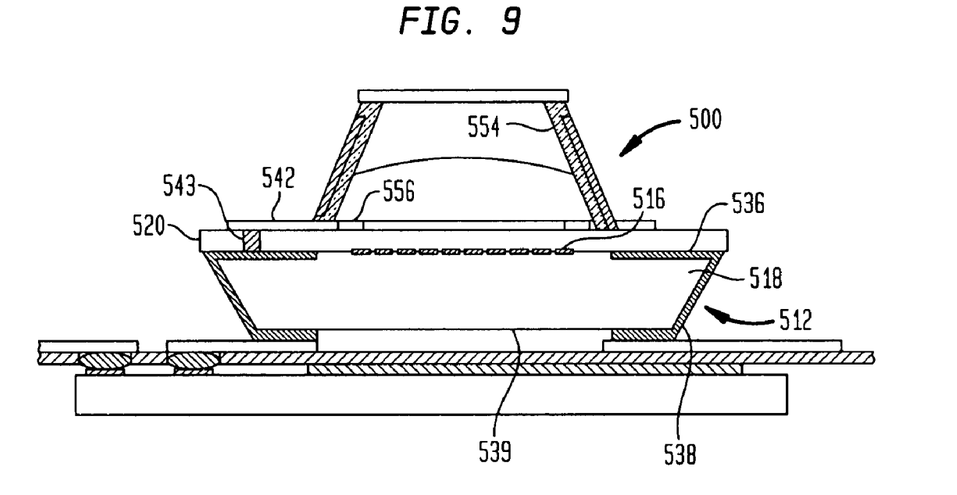
FIG. 9 is a view similar to FIG. 8, but depicting a digital camera according to yet another embodiment of the invention.

A digital camera 500 according to yet another embodiment of the invention (FIG. 9) includes a subassembly incorporating a sensor 512 and a structure 526 for holding the fluids defining the meniscus. Sensor 512 includes a semiconductor chip 518 having sensitive elements 516 on a chip front surface 536. Chip 518 has "wraparound" leads 538 which extend from the chip front surface to terminals 540 on the opposite, rear surface 539 of the chip. Here again, the sensor includes a cover 520 or a passivation layer forming the front surface of the sensor. In this embodiment, the container structure 526 includes a self-supporting metallic structure with the dielectric layer or coating 554 covering the entire interior surface of this structure. Thus, container structure 526 serves in its entirety as one of the electrodes. The electrode 556 is provided as a flat metallic ring on the front surface of the sensor. Also, in this arrangement, the electrically conductive liquid 564 lies closest to the sensor, whereas the non-conductive liquid or oil 566 lies remote from the sensor, on the opposite side of meniscus 568. Electrode 556 is electrically isolated from electrode 526, but is connected to one or more of the wraparound leads 538, as, for example, by a trace 542 and a through conductor 543 extending through the cover. The opposite electrode 526 may be connected to one of the wraparound electrodes 538 in a similar manner. Alternatively, one or both of the electrodes may be connected to specialized wraparound leads which extend onto the outer surface 524 of the cover, rather than between the cover and chip 518, as depicted in FIG. 9. The other wraparound leads are connected to the internal circuitry (not shown) within sensor 512. Chips with wraparound leads of this type are known in the art; such chips are disclosed, for example, in U.S. Pat. No. 6,646,289 and, therefore, are not described further herein. The subassembly can be mounted in a face-up configuration, with container 526 pointing away from a circuit panel, as, for example, by surface-mounting terminals 540 on the front surface 592 of a circuit panel 590. The camera module further includes a piezoelectric transformer 570 mounted to the rear of the circuit panel. In this configuration as well, at least a part of the piezoelectric transformer 570 is aligned with the sensor 512 in the horizontal directions, parallel to the plane of the circuit panel.

The various features discussed above can be interchanged among the different embodiments. For example, the configuration of the container depicted in FIG. 9 with a solid, self-supporting metal wall can be used in the other embodiments discussed above. Conversely, the container 526 can incorporate a dielectric wall with a metallic conductive layer as shown, for example, in FIG. 1. Also, the piezoelectric transformer can be mounted to the container structure 526 or to the sensor 512 in a face-up embodiment of the type depicted in FIG. 9. A sensor incorporating a cover as depicted in FIG. 1 can be substituted for the sensor shown in FIG. 8, which omits the cover, and vice-versa.

Numerous other variations and combinations of the features discussed above can be utilized without departing from the invention. Merely by way of example, it is not essential to mount the piezoelectric transformer in alignment with the sensor; if available space on a circuit panel permits, the piezoelectric transformer can be mounted in any location. Also, it is not essential to place parts of the assembly on opposite sides of a circuit panel; all of the components may lie on one side of the circuit panel. Indeed, the camera need not incorporate a circuit panel at all. In other variants, the camera may include a multiplicity of refractive meniscus interfaces in series, as, for example, a layer of an aqueous liquid forming a first meniscus with a layer of an oil immiscible with the first liquid, followed by a layer of a third liquid which is immiscible with the wall and desirably also immiscible with the aqueous liquid. These may be driven by the same piezoelectric transformer or by a plurality of transformers, at least one of which is a piezoelectric transformer. Also, the optical module including the lens and piezoelectric transformer may be used by itself or with devices other than an optoelectronic sensor as, for example, in a film-based camera or other optical instrument. A sensor module or subcombination incorporating an optoelectronic sensor and a piezoelectric transformer may be used as a component of a digital camera.

Unless otherwise specified, elements which are referred to herein as "connected" to one another, "attached" to one another, "mounted" to one another in those terms or in terms of similar meaning need not be directly connected, mounted or attached to one another, but may also be connected, mounted or attached to one another through intermediate structures intervening between the specified elements.

As these and other variations and combinations of the features discussed herein can be utilized without departing from the present invention, the foregoing description of the preferred embodiments should be taken by way of illustration rather than by way of limitation of the invention as defined by the claims.

The invention claimed is:

1. A variable optical element comprising:
(a) a lens including a first liquid, a second liquid having an index of refraction different from said first liquid, a structure defining a space containing said liquids, and control electrodes in proximity to said first and second liquids, said first and second liquids forming a meniscus therebetween, said electrodes and said liquids being arranged so that the curvature of said meniscus can be altered by varying an electrical potential between said electrodes; and
(b) a piezoelectric transformer including a primary piezoelectric element and a secondary piezoelectric element mechanically linked to said primary piezoelectric element, said secondary piezoelectric element being electrically connected to said control electrodes, said piezoelectric transformer being arranged to convert a primary electrical signal applied to said primary piezoelectric element into mechanical motion and to convert the mechanical motion into a secondary electrical signal in said secondary piezoelectric element, whereby said secondary electrical signal will be applied to said control electrodes, and wherein said piezoelectric transformer has a step-up ratio of about 10:1 to about 100:1.

2. The An optical module including a variable optical element comprising:
(a) a lens including a first liquid, a second liquid having an index of refraction different from said first liquid, a structure defining a space containing said liquids, and control electrodes in proximity to said first and second liquids, said first and second liquids forming a meniscus therebetween, said electrodes and said liquids being arranged so that the curvature of said meniscus can be altered by varying an electrical potential between said electrodes;
(b) a piezoelectric transformer including a primary piezoelectric element and a secondary piezoelectric element mechanically linked to said primary piezoelectric element, said secondary piezoelectric element being electrically connected to said control electrodes, said piezoelectric transformer being arranged to convert a primary electrical signal applied to said primary piezoelectric element into mechanical motion and to convert the mechanical motion into a secondary electrical signal in said secondary piezoelectric element, whereby said secondary electrical signal will be applied to said control electrodes, and wherein said secondary piezoelectric element is directly attached to said primary piezoelectric element;
(c) a structure containing said liquids, said control electrodes being mounted to said structure and wherein said piezoelectric transformer is mechanically connected to said structure; and
(d) lens control terminals electrically connected to said primary piezoelectric element.

3. The module of claim 2 wherein said lens control terminals are carried on said piezoelectric transformer.

4. The module of claim 2 wherein said lens control terminals are carried on said structure.

5. A camera module comprising a variable optical element as claimed in claim 2, and an optoelectronic sensor, mechanically connected to said structure.

6. The camera as claimed in claim 5 further comprising lens control terminals electrically connected to said primary piezoelectric element.

7. The camera module of claim 6 wherein said optoelectronic sensor includes a semiconductor chip incorporating a plurality of optically sensitive elements and a cover overlying said chip and defining a front surface.

8. The camera module of claim 7 wherein said lens control terminals are carried on said cover.

9. The camera module of claim 8 further comprising sensor terminals carried on said cover and electrically connected to said semiconductor chip.

10. The camera module of claim 9 wherein said cover has an inner surface facing toward said chip and an outer surface facing away from said chip, said sensor terminals and said lens control terminals being exposed at said outer surface of said cover.

11. The camera module of claim 10 wherein said structure includes a container wall projecting from said outer surface and extending away from said chip, said container wall at least partially defining said space.

12. The camera module of claim 11 wherein at least one of said control electrodes is mounted to said container wall.

13. The camera module of claim 11 wherein said container wall projects in a central region of said front surface and said lens control terminals are disposed in a peripheral region of said front surface outside of said central region, the module further comprising sensor terminals disposed in said peripheral region of said front surface and electrically connected to said chip.

14. The camera module of claim 13 wherein said terminals are adapted for surface-mounting to a circuit panel.

15. A digital camera comprising:
(a) a lens assembly including a first liquid, a second liquid having an index of refraction different from said first liquid, control electrodes in proximity to said first and second liquids, and a structure containing said liquids, said first and second liquids forming a meniscus therebetween, said electrodes and said liquids being arranged so that the curvature of said meniscus can be altered by varying an electrical potential between said electrodes;
(b) a piezoelectric transformer including a primary piezoelectric element and a secondary piezoelectric element mechanically linked to said primary piezoelectric element, said secondary piezoelectric element being electrically connected to said control electrodes, said piezoelectric transformer being arranged to convert a primary electrical signal applied to said primary piezoelectric element into mechanical motion and to convert the mechanical motion into a secondary electrical signal in said secondary piezoelectric element, whereby said secondary electrical signal will be applied to said control electrodes;
(c) an optoelectronic sensor mounted in a preselected spatial relationship to the structure; and
(d) a circuit panel, said optoelectronic sensor, said container structure and said piezoelectric transformer being mechanically connected to said circuit panel, and wherein said transformer is mounted to said sensor and mechanically connected to said circuit panel by said sensor.

16. The digital camera of claim 15 wherein said transformer is mounted to said structure and mechanically connected to said circuit panel by said structure.

17. The digital camera of claim 15 wherein said transformer is mounted directly to said circuit panel.

18. The digital camera of claim 15 wherein said optoelectronic sensor, lens assembly, and piezoelectric transformer occupy an area of said circuit panel about twice the frontal area of said sensor or less.

19. The digital camera of claim 15 wherein said piezoelectric transformer is at least partially aligned with said sensor in horizontal directions parallel to said circuit panel.

20. The digital camera of claim 15 wherein said circuit panel has oppositely-directed front and rear sides, said optoelectronic sensor is disposed to the rear of said circuit panel and said lens assembly is disposed at least partially in front of said circuit panel.

21. The digital camera of claim 20 wherein said piezoelectric transformer is disposed at least partially in front of said circuit panel, said lens assembly projects forwardly from said circuit panel by a first distance, and said piezoelectric transformer projects forwardly from said circuit panel by a second distance less than said first distance.

* * * * *

UNITED STATES PATENT AND TRADEMARK OFFICE
CERTIFICATE OF CORRECTION

| | |
|---|---|
| PATENT NO. | : 7,443,597 B2 |
| APPLICATION NO. | : 11/318821 |
| DATED | : October 28, 2008 |
| INVENTOR(S) | : Giles Humpston |

Page 1 of 1

It is certified that error appears in the above-identified patent and that said Letters Patent is hereby corrected as shown below:

Column 2, line 6, "PDA's" should read --PDAs--
Column 4, line 67, "terminals not to" should read --terminals not connected to--
Column 13, line 33, delete "The" before --An optical--

Signed and Sealed this

Nineteenth Day of January, 2010

David J. Kappos
*Director of the United States Patent and Trademark Office*